(12) United States Patent
Beermann et al.

(10) Patent No.: US 12,092,688 B2
(45) Date of Patent: *Sep. 17, 2024

(54) CIRCUIT FOR TRANSFERRING DATA FROM ONE CLOCK DOMAIN TO ANOTHER

(71) Applicant: Advantest Corporation, Tokyo (JP)

(72) Inventors: Andreas Beermann, Stuttgart (DE); Martin Mücke, Stuttgart (DE)

(73) Assignee: Advantest Corporation, Tokyo (JP)

(*) Notice: Subject to any disclaimer, the term of this patent is extended or adjusted under 35 U.S.C. 154(b) by 228 days.

This patent is subject to a terminal disclaimer.

(21) Appl. No.: 17/733,377

(22) Filed: Apr. 29, 2022

(65) Prior Publication Data

US 2022/0260635 A1 Aug. 18, 2022

Related U.S. Application Data

(63) Continuation of application No. PCT/EP2020/060143, filed on Apr. 9, 2020.

(51) Int. Cl.
*G01R 31/317* (2006.01)
*G01R 31/319* (2006.01)
(Continued)

(52) U.S. Cl.
CPC . *G01R 31/31727* (2013.01); *G01R 31/31726* (2013.01); *G01R 31/31917* (2013.01);
(Continued)

(58) Field of Classification Search
CPC ........ G01R 31/31727; G01R 31/31726; G01R 31/31917; H03M 1/66; H03M 1/12;
(Continued)

(56) References Cited

U.S. PATENT DOCUMENTS

| 5,987,081 A | 11/1999 | Csoppenszky |
| 2005/0008110 A1 | 1/2005 | Lake et al. |

(Continued)

FOREIGN PATENT DOCUMENTS

EP 1031093 B1 8/2000

OTHER PUBLICATIONS

Thilo Ohlemueller et al.; "Sample Synchronization of Multiple Multiplexed DA and AD Converters in FPGAs", Design and Diagnostics of Electronic Circuits & Systems (DDECS), 2011 IEEE 14th International Symposium on, IEEE, Apr. 13, 2011;pp. 301-304, XP031877347, DOI: 10.1109/DDECS.2011.5783100 ISBN:978-1-4244-9755-3; p. 2, col. 1-col. 2; figures 2-4; 4 pages.

*Primary Examiner* — Amy He

(57) ABSTRACT

The invention concerns a circuit for transferring a data from one clock domain to another clock domain, the circuit comprising: a digital circuit configured to generate a data signal synchronized with a source clock signal, and to receive such data by sampling the data signal synchronized with a target clock signal; a phase comparator which is configured to determine a phase relationship between the source clock signal and the target clock signal; and a data signal synchronization circuit configured to receive data signal transitions that are synchronized with the source clock signal, and to provide a synchronized data signal transitions of which are synchronized with the target clock signal.

20 Claims, 16 Drawing Sheets

(51) Int. Cl.
    *H03M 1/06*         (2006.01)
    *H03M 1/66*         (2006.01)
    *H04L 7/00*          (2006.01)

(52) U.S. Cl.
    CPC ........... *H03M 1/0624* (2013.01); *H03M 1/66* (2013.01); *H04L 7/0012* (2013.01)

(58) Field of Classification Search
    CPC .... H03M 1/0624; H04L 7/0041; H04L 7/005; H04L 7/0012
    See application file for complete search history.

(56) References Cited

U.S. PATENT DOCUMENTS

| | | |
|---|---|---|
| 2015/0117582 A1 | 4/2015 | Buckler et al. |
| 2018/0115406 A1 | 4/2018 | Moore et al. |
| 2022/0263515 A1* | 8/2022 | Beermann ............... H04L 7/005 |

\* cited by examiner

| case | 1 | 2 | | 3 |
|---|---|---|---|---|
| phase | 0 | 0.25 | 0.75 | 1 |
| edge_select | falling | rising | | falling |
| delay_select | | no delay | | delay |

Fig. 8

CIRCUIT FOR TRANSFERRING DATA FROM ONE CLOCK DOMAIN TO ANOTHER

CROSS-REFERENCES TO RELATED APPLICATIONS

This application is a continuation of copending International Application No. PCT/EP2020/060143, filed Apr. 9, 2020, which is incorporated herein by reference in its entirety.

TECHNICAL FIELD

The present invention relates to a circuit for transferring data from one clock domain to another clock domain, a test apparatus for testing a device under test and a method for transferring data from one clock domain to another clock domain.

BACKGROUND OF THE INVENTION

As modern System-on-Chip (SoC) designs continue to face increasing size and complexity challenges, multiple asynchronous clock domains have been employed for different I/O interfaces. A CDC-based (Clock Domain Crossing) design is a design that has one clock asynchronous to, or has a variable phase relation with, another clock. Transferring signals between asynchronous clock domains may lead to setup or hold timing violations. These violations may cause signals to be meta-stable. Even if synchronizers could eliminate the meta-stability, incorrect use, such as convergence of synchronized signals or improper synchronization protocols, may also result in functional CDC errors. Functional validation of such SoC designs is one of the most complex and expensive tasks.

Within one clock domain, proper static timing analysis (STA) can guarantee that data does not change within clock setup and hold times. When signals pass from one clock domain to another asynchronous domain, there is no way to avoid meta-stability since data can change at any time.

As the CDC errors are not addressed and verified early in the design cycles, many designs exhibit functional errors only late in their design cycles or during post-silicon verification. Several coverage metrics are proposed to measure the validation's adequacy and progress, such as code based coverage, finite state machine coverage, and functional coverage. Nevertheless, these coverage metrics do not have direct relations with CDC issues.

In addition, in a system for testing a device it has a signal, i.e. start signal of the test, e.g. TEST_EN, that is driven by flip flops on the source domain e.g. SYNCCLK. This start signal must be carried into a target clock domain, e.g. FIFOCLK which has the same clock frequency as SYNCCLK, but an unknown phase relation to SYNCCLK. During testing the SYNCCLK will turn on and off for each individual test run. That means that for each test the phase relation will be different so it is impossible to solve the clock domain transition with a static solution, e.g. done by a STA, because this cannot adopt to the phase changes.

The most common solution for the above mentioned problem is the two-flip-flop circuit solution as shown in FIG. 15. In FIG. 15, it has the downside that the signal received across the clock domain transition has a timely ambiguity of 2 clock cycles. This happens whenever the signal changes in the setup/hold time window around the capturing clock edge. In this case it is unknown if the old state or the new state of the signal is being captured. Meta-stability is not the only root cause of this randomness. Also jitter, signal noise and power noise can influence this. But in the end, it means that it cannot start the test at exactly the clock cycle that it is demanded.

The solution to remove this ambiguity is to use a PLL that is shifting one of the two clock domains in phase (not frequency) in a way that the setup and hold time criteria of the receiving clock domain is fulfilled as shown for example, in FIG. 15. Downside of this is that the PLL settling time is very long (some ms) and one PLL per clock domain crossing is required. For high speed testing, this is not acceptable.

To accurately verify clock domain crossings, it is necessary to avoid ambiguity on sampling the signal. This ambiguity happens whenever the signal violates the setup/hold criteria at the capturing FF. In this case meta-stability can occur making it unpredictable what logic level is being captured. This uncertainty lasts for one clock cycle. This results in a timely ambiguity of the captured signal of 2 clock cycles.

Conventional circuit for transferring data from one clock domain to another clock domain, for example, a circuit shown in FIG. 16 as a diagram and shown in FIG. 17, it is necessary to resynchronize on each phase change of the SYNCCLK. That is, synchronizing/resynchronizing for each new test run requires about 1 ms PLL setting time. The first input datum marks the beginning of waveform and therefore, it is required stringent timing at data interface. That is, as shown in FIG. 15, FF 1 determinates enable transition and a phase detector, PD, ensures known Phase alignment. A clock 3 is a delayed clock 1 (n=1) or multiple of the clock 1 (n>1).

Hence, it is an object of the present invention to avoid these disadvantages and, hence, to provide an improved concept for a circuit for transferring data from one clock domain to another clock domain at an accurate timing.

This object is solved by a circuit for transferring data from one clock domain to another clock domain according to claim 1, a test apparatus for testing a device under test comprising a circuit according to the present application according to claim 13 and a method for transferring data from one clock domain to another clock domain according to claim 16.

Some embodiments of the present invention also provide a computer program for carrying out steps of the inventive method.

SUMMARY OF THE INVENTION

According to a first aspect of the present application, a circuit for transferring data from one clock domain to another clock domain, the circuit comprising: a digital circuit configured to generate a data signal transitions of which are in synchronism of a source clock signal, e.g. which is a clock signal to indicate a timing for out putting a data based on a input data value associated with a sample time on a time grid, equally spaced in terms of time, and to receive such data by sampling the data signal in synchronism with a target clock signal, e.g. which is a clock signal to indicate a timing for receiving provided data; a phase comparator, e.g. coupled to the processor to receive the synchronizing clock signal, and coupled to the converter to receive the converter clock signal, wherein the phase comparator is configured to determine a phase relationship between the source clock signal and the target clock signal, i.e. the phase comparator performs comparison of timing of a rising edge or a falling edge between the synchronizing clock signal and the converter clock signal, thereby performing phase comparison between the signals; and an data signal synchronization circuit, e.g. comprising a first flipflop FF, a selector and a second flipflop FF, configured to receive a data signal, e.g. which is provided in synchronism with the synchronizing clock signal, transitions of which are in synchronism with the source clock signal, and to provide a synchronized data signal transitions of which are in synchronism with the target clock signal on the basis thereof; wherein the data signal synchronization circuit is configured to switch between a provision of the synchronized data signal on the basis of a sampling of the data signal in response to a rising edge of the target clock signal and a provision of the synchronized data signal on the basis of a sampling of the data signal in response to a falling edge of the target clock signal in dependence on the determined phase relationship between the source clock signal and the target clock signal; wherein there is a predetermined frequency relationship between the source clock signal and the target clock signal, e.g. locked at the predetermined value.

According to embodiments of the present application, the data signal synchronization circuit is configured to select, in dependence on the information about the phase relationship between the source clock signal and the target clock signal, between a first mode, in which the data signal, which is in temporal synchronism with the source clock signal, is sampled at edges of a first edge type, e.g. at falling edges, of the target clock signal, to obtain an intermediate signal, and in which the intermediate signal is sampled at edges of a second edge type, e.g. rising edges, of the target clock signal, to obtain the synchronized data signal which is in temporal synchronism with the target clock signal, and a second mode, in which the data signal, which is in temporal synchronism with the source clock signal, is sampled at edges of the second edge type, e.g. rising edges, of the target clock signal, to obtain the synchronized data signal which is in temporal synchronism with the target clock signal.

According to the embodiments of the present application, the data signal synchronization circuit comprises: a first flip-flop circuit configured to receive the data signal, e.g. which is a test signal on the different clock domain as the converter clock signal and provided from the processor for aligning the output timing of the signal data, wherein the first flip-flop circuit is configured to sample the data signal at a first sampling phase, e.g. when the phase relationship indicates that a value of a phase difference between the synchronizing clock signal and the converter clock signal is in a first predetermined range, e.g. smaller than a predetermined value, in case the phase difference has a potential risk to lead metastability, the phase of sampling the enable signal is inverted to move sampling time instances away from clock edges of the synchronization clock signal, to obtain a sampled signal; a signal selector configured to receive the data signal and coupled to the first flip-flop circuit to receive the sampled signal, wherein the signal selector is configured to select one of the received signals, e.g. in dependence on the phase relationship to obtain a selected signal; a second flip-flop circuit coupled to the signal selector to receive the selected signal, wherein the second flip-flop circuit is configured to sample the selected signal, e.g. the data signal, or the sampled signal, at a second sampling phase, e.g. when the phase relationship is in a second predetermined range, which is different from the first predetermined range and typically non-overlapping with the first predetermined range, and which may, for example, indicate that a value of a phase difference between the synchronizing clock signal and the converter clock signal is larger than a predetermined value; in this case, the edge of the sampled signal is synchronized with the converter clock signal, i.e. output timing of the signals are aligned and therefore, it is not necessary to align the rising timing of the clock signal.

According to the embodiments of the present application, wherein the source clock signal is provided from a device or used by a device, e.g. from a processor, or a memory, or loop-back interface and etc., wherein the digital circuit is a converter configured to convert data between analog and digital, e.g. between a digital representation and an analog representation, e.g. from a digital representation to an analog representation or from an analog representation to a digital representation, and wherein the data signal is an enable signal triggering the analog/digital conversion of a signal, i.e. the enable signal is provided in synchronism with the synchronizing clock signal.

According to the embodiments of the present application, the data signal synchronization circuit further comprises: a first-in-first-out circuit coupled to a data source, e.g. the digital signal processor, to receive the signal data, and coupled to the second flip-flop circuit, which calculates delay time based on the phase difference between the enable signal and the converter clock signal, to receive an output signal of the second flip-flop, or a delayed version of an output signal of the second flip-flop circuit, e.g. which indicates a signal data output timing of the converter, wherein the first-in-first-out circuit provides signal data to the converter in response to the output signal of the second flip-flop circuit.

According to the embodiments of the present application, the first-in-first-out circuit is coupled to the output of the second flip-flop circuit via a delay circuit which delays the output signal of the second flip-flop circuit, e.g. in accordance with the conversion data clock signal. In addition, selector comprises a multiplexer, wherein the multiplexer selects one of input signals based on the information about the phase relationship.

According to the embodiments of the present application, the phase comparator comprises a phase-to-digital converter, wherein the phase-to-digital converter is configured to measure the phase difference between the source clock signal and the target clock signal for determining the phase relationship. In addition, the circuit comprises an oscillator, wherein an output signal of the oscillator is used as the target clock signal or wherein the circuit is configured to derive the target clock signal from the output signal of the oscillator.

According to the embodiments of the present application, the circuit is configured to derive the source clock signal and the target clock signal from a common reference signal, such that frequencies of the source clock signal and of the target clock signal are in a predetermined relationship, for example, are regulated to be in a predetermined relationship, and such that there is no phase lock between a phase of the source clock signal and a phase of the target clock signal, for example, such that phases of the synchronizing clock signal and of the converter clock signal can freely float with respect to each other. Furthermore, the converter is a digital-to-analog converter or an analog-to-digital converter.

A second aspect of the present application, a test apparatus for testing a device under test, comprising the circuit according to the present application. According to an embodiment of the present application, the test apparatus is configured to perform, e.g. to start a test flow, for example, a test flow using multiple channel modules providing signals to the device under test and evaluating signals received from a device under test in synchronism with the source clock signal.

According to the embodiment of the present application, the test apparatus is configured to provide an analog signal obtained using the converter on the basis of signal values provided by the device to the device under test, e.g. to thereby stimulate the device under test, and/or wherein the device is configured to obtain digital data, e.g. provided by a data source, i.e., a digital signal processor, on the basis of a digitized device-under-test signal obtained from the digital circuit using the fractional delay filtering and to evaluate the digital data, e.g. to characterized the device under test.

According to a third aspect of the present application, a method for transferring data from one clock domain to another clock domain, the method comprising: receiving a source clock signal from a device or used by a device and a target clock signal used by a digital circuit; determining a phase relationship between the source clock signal and the target clock signal; receiving a data signal from the device, and providing a synchronized data signal on the basis thereof; and switching between a provision of the synchronized data signal on the basis of a sampling of the data signal in response to a rising edge of the target clock signal and a provision of the synchronized data signal on the basis of a sampling of the data signal in response to a falling edge of the target clock signal in dependence on the determine phase relationship between the source clock signal and the target clock signal; wherein a frequency relationship between the source clock signal and the target clock signal is locked at the predetermined value.

According to a fourth aspect of the present application, computer program is provided, wherein the computer program is configured to implement the above described method, when being executed on a computer or micro controller, so that the above described method is implemented by the computer program.

BRIEF DESCRIPTION OF THE FIGURES

In the followings, embodiments of the present application are described in more detail with reference to the figures in which:

FIG. 8 shows a schematic diagram of an operation processing block as it could be implemented in one of the embodiments of the present application;

DETAILED DESCRIPTION OF THE EMBODIMENTS

The following description sets forth specific details such as particular embodiments, procedures, techniques and etc. for purpose of explanation and not limitation. It will be appreciated by those skilled in the art that other embodiments may be employed apart from these specific details. For example, although the following description is facilitated using non-limiting example applications, the technology may be employed to any type of converters. In some instances, detailed description of well-known methods, interfaces, circuits and devices are omitted so as to not obscure the description with unnecessary detail.

Equal or equivalent elements with equal or equivalent functionality are denoted in the following description by equal or equivalent reference signs.

Figure 1:
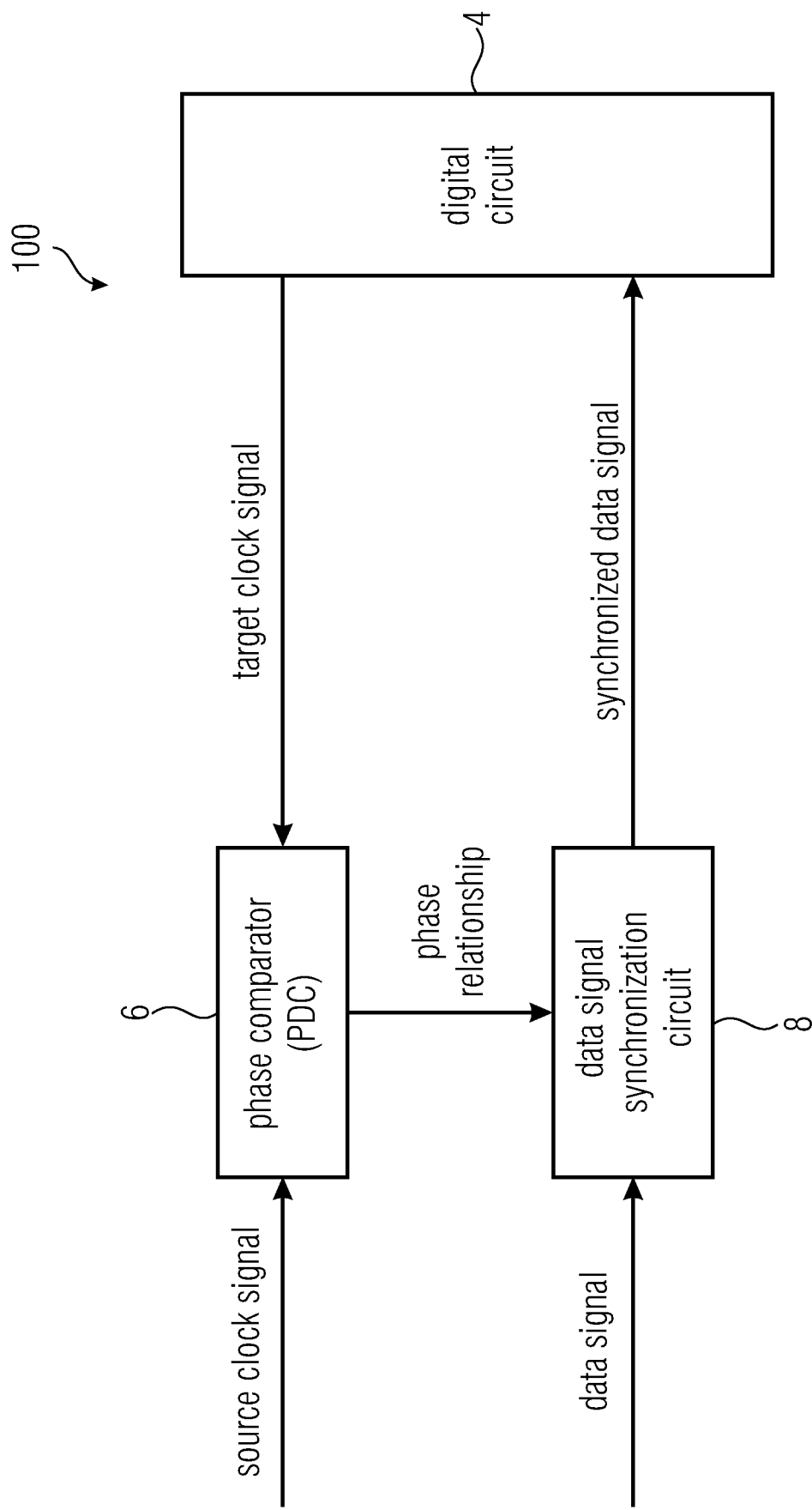
FIG. 1 shows a schematic block diagram of a circuit for transferring data from one clock domain to another clock domain according to a first embodiment of the present invention of the present application.

FIG. 1 shows a schematic block diagram of a circuit for transferring data from one clock domain to another clock domain according to a first embodiment of the present invention. A circuit 100 comprises a digital circuit 4, a phase comparator, PDC, 6 and data signal synchronization circuit 8.

The digital circuit 4, i.e. another clock domain, is coupled to the PDC 6 and provides a target clock signal to the PDC 6. In addition, the digital circuit 4 is coupled to the data signal synchronization circuit 8 and receives synchronized data signal, i.e. the digital circuit 4 is configured to generate a data signal transition of which are in synchronism of a source clock signal, and to receive such data by sampling the data in synchronism with a target clock signal. The digital circuit may be a converter, i.e. digital-to-analog or analog-to-digital converter.

The PDC 6 is coupled to the digital circuit 4 to receive the target clock signal, e.g. converter clock signal in case the digital circuit 4 is a converter, and to receive source clock signal, e.g. a synchronizing clock signal which is a clock signal to indicate a timing for outputting a data based on an input data value associated with a sample time on a time grid, e.g. equally spaced in terms of time, from one clock domain. The PDC 6 is configured to perform comparison of timing of a rising edge or a falling edge between the source clock signal, e.g. synchronizing clock signal, and the target clock signal, e.g. converter clock signal, thereby performing phase comparison between the signals. That is, the circuit 100 is configured to select, in dependence on the information about the phase relationship between the synchronizing clock signal and the converter clock signal, between a first mode, in which the enable signal triggering a conversion of data between digital and analog, which is in temporal synchronism with the synchronization clock signal, is sampled at edges of a first edge type, e.g. at falling edges, of the converter clock signal, to obtain an intermediate signal, and in which the intermediate signal is sampled at edges of a second edge type, e.g. rising edges, of the converter clock signal, to obtain the enable signal which is in temporal synchronism with the converter clock signal, and a second mode, in which the enable signal triggering a conversion of data between digital and analog, which is in temporal synchronism with the synchronization clock signal, is sampled at edges of the second edge type of the converter clock signal, to obtain the enable signal which is in temporal synchronism with the converter clock.

As described above, the PDC 6 detects the phase difference between, for example, the synchronizing clock signal and the convert clock signal. In addition, the PDC 6 comprises a phase-to-digital converter, wherein the phase-to-digital converter is configured to measure a phase difference between the synchronizing clock signal and the converter clock signal for determining the phase relationship.

The data signal synchronization circuit 8 is coupled to the PDC 6 to receive an information about the phase relationship, e.g. phase difference between the synchronizing clock signal and the target clock signal, and configured to receive a data signal which is provided in synchronism with the source clock signal transitions of which are in synchronism with the source clock signal, and to provide a synchronized data signal transitions of which are in synchronism with the target clock signal on the basis thereof. In addition, the data signal synchronization circuit 8 is configured to switch between a provision of the synchronized data signal on the basis of a sampling of the data signal in response to a rising edge of the target clock signal and a provision of the synchronized data signal on the basis of a sampling of the data signal in response to a falling edge of the target clock signal in dependence on the determined phase relationship between the source clock signal and the target clock signal.

Figure 2:
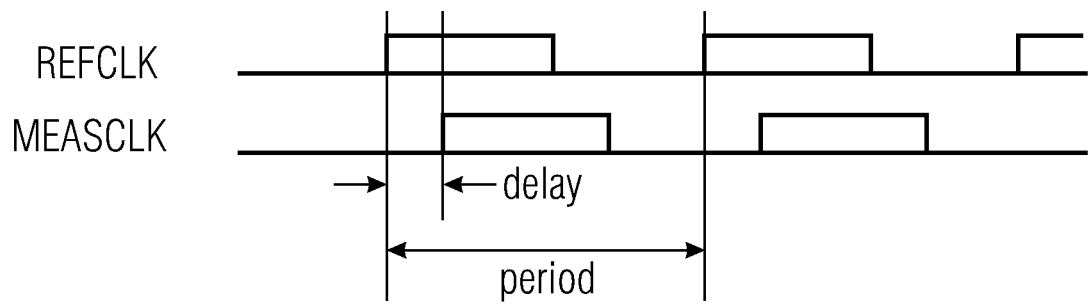
FIG. 2 shows a schematic timing diagram of a phase comparator according to the first embodiment of the present invention of the present application.
Figure 3:
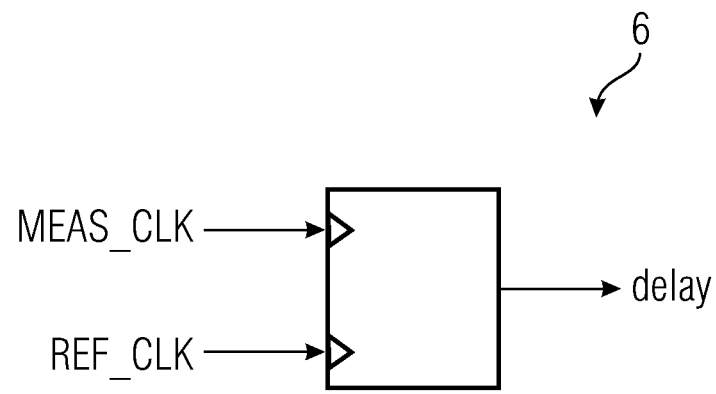
FIG. 3 shows a schematic block diagram of the phase comparator according to FIG. 2 in accordance with the present invention concept of the present application.

FIG. 2 shows a schematic timing diagram of the PDC 6 and FIG. 3 shows a schematic block diagram of the PDC 6. As shown in FIGS. 2 and 3, a reference clock signal REFCLK/REF_CLK and a measurement clock signal MEASCLK/MEAS_CLK are provided to the PDC 6. Then, the PDC 6 delivers the delay between rising REF_CLK edge, i.e. rising edge of the reference clock signal, to rising MEAS_CLK edge, i.e., the rising edge of the measurement clock signal. As described above, the PDC 6 determines the phase difference between MEASCLK and REFCLK. This phase difference can be calculated as: phase=delay/period. The delay is the absolute time difference of both clock edges. Hence, The PDC 6 must be accurate when the fractional feature of the digital signal processor, DSP, comes into the game. For the simple decision which clock edge is used for capturing the data signal, the PDC accuracy must not necessarily be very high.

According to the first embodiment of the present invention, the phase difference between one clock domain, e.g. a device configured to provide a data signal, i.e. a processor, a memory or a loop-back interface, and another clock domain, e.g. the digital circuit 4 is measured by the PDC 6. In addition, based on the determined phase difference, the data signal synchronization circuit 8 can switch a provision of the synchronized data signal between based on rising edge of the target signal and based on falling edge of the target signal. Hence, it is possible to avoid cycle slip caused by the phase ambiguity and to transfer the data signal correct and with accurate timing.

In addition, for the PDC 6 measurement, the measurement takes only short time, e.g. 1 to 10 microseconds. Contrary to this, in case of PLL approach in the known art, it is required to wait for PLL settling longer, e.g. 1 millisecond. Therefore, the circuit 100 is possible to perform faster.

Figure 4:
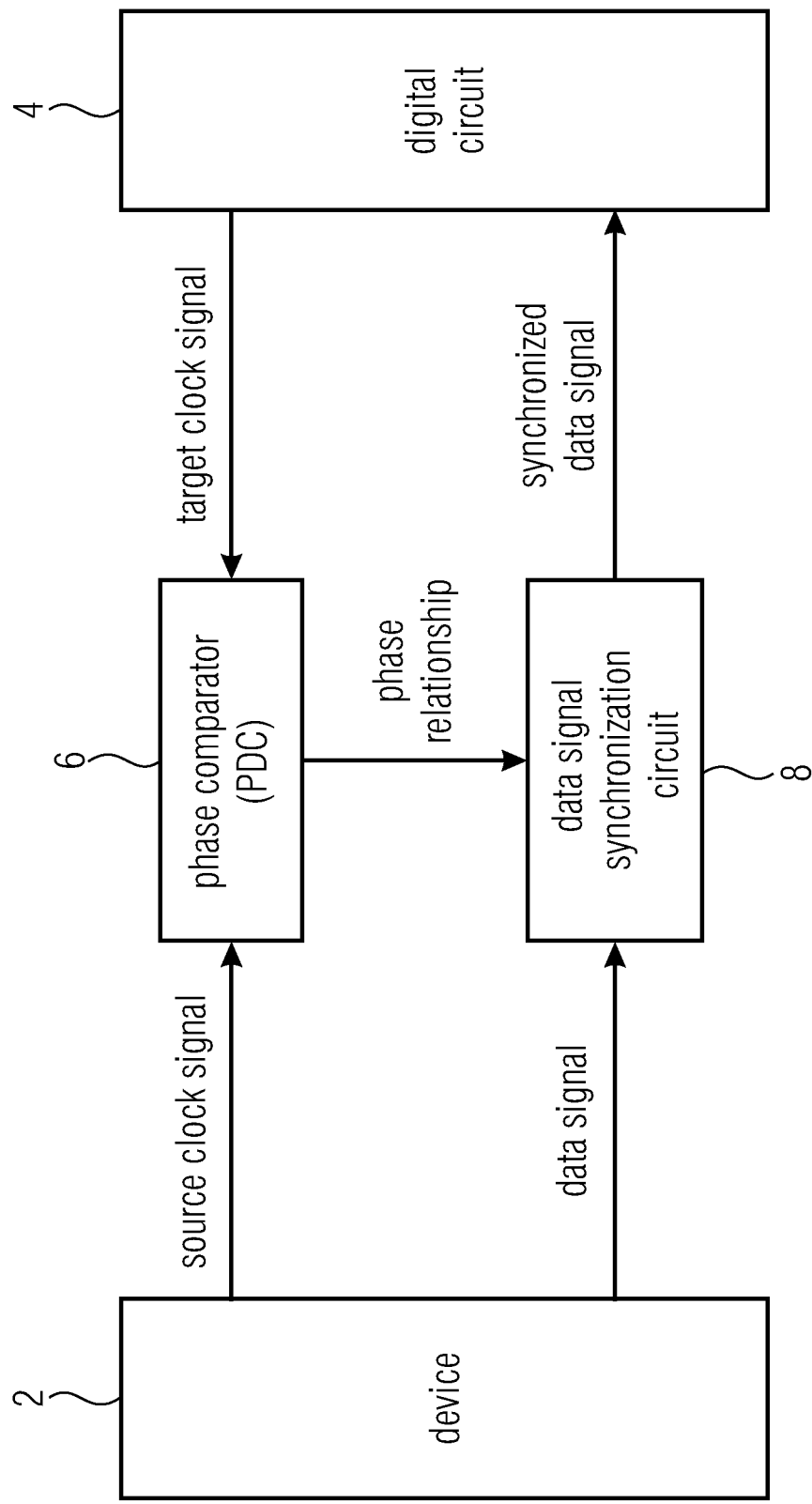
FIG. 4 shows a block diagram of a circuit for transferring data from one clock domain to another clock domain according to a second embodiment of the present invention of the present application.

FIG. 4 shows a block diagram of a circuit for transferring data from one clock domain to another clock domain according to a second embodiment of the present invention. The difference from the first embodiment is a device 2, i.e., the circuit 200 according to the second embodiment further comprises the device 2 which is configured to provide or uses a source clock signal. Therefore, the device 2 is coupled to the PDC 6 to provide a source clock signal and coupled to the data signal synchronization circuit 8 to provide a data signal. Other configuration of the circuit 200 is the same as the circuit 100 and further explanation is omitted to avoid unnecessary repeated description.

The circuit 100, 200 may comprise an oscillator, e.g. a voltage controlled saw oscillator, wherein an output signal of the oscillator is used as the converter clock signal or wherein the circuit is configured to derive the converter clock signal from the output signal of the oscillator. The circuit is configured to derive the synchronizing clock signal and the converter clock signal from a common reference signal, such that frequencies of the synchronizing clock signal and of the converter clock signal are in a predetermined relationship.

Figure 5:
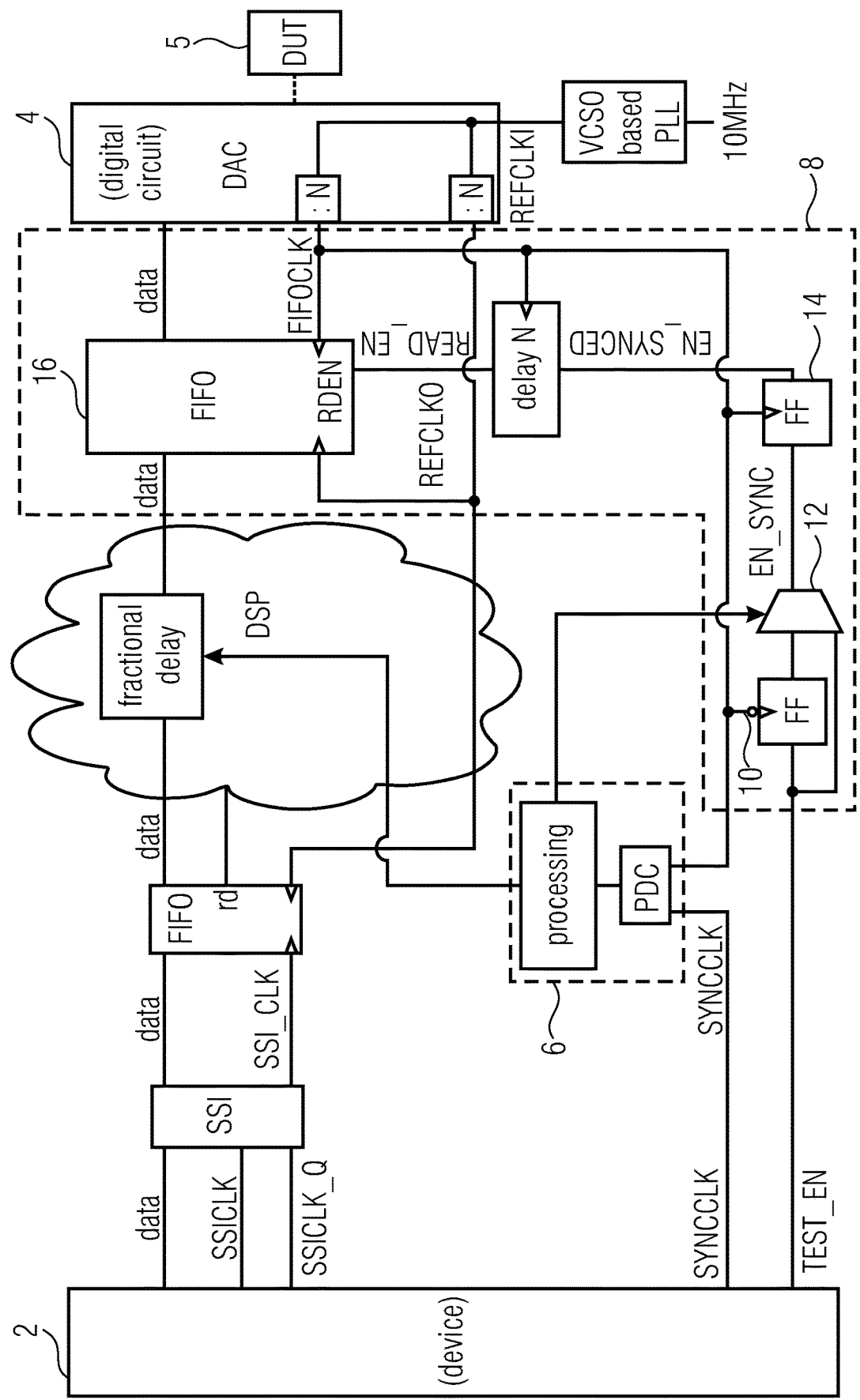
FIG. 5 shows a schematic block diagram indicating a test apparatus for testing a device under test according to a third embodiment of the present invention of the present application.

FIG. 5 shows a schematic block diagram according to a third embodiment of the present invention. It is shown a test apparatus for testing a device under test 5, which is connecting to the output of the digital circuit (DAC) 4, comprising a circuit according to the present invention. As shown in FIG. 5, the data signal synchronization circuit 8 comprises a first flip-flop circuit, FF, 10, a signal selector, e.g. multiplexer 12, a second flip-flop circuit, FF, 14 and a first-in-first-out circuit, FIFO 16. The FIFO 16 is coupled to a data source, e.g. a digital signal processor, to receive the signal data, and coupled to the second FF 14 via an additional Delay circuit ("Delay N") that is used to delay the output signal of FF 14 by a programmable number of target clock signal cycles. The number of clock cycles is chosen in a way that the FIFO enable signal READ_EN is becoming active exactly at the correct point in time when enough data is available in the FIFO and the device under test is supposed to receive the data via the DAC, wherein the FIFO 16 provides signal data to the converter in response to the output signal of the delay circuit, READ_EN.

The first FF10 is coupled to the device 2, e.g. a processor, a memory or a loop-back interface, for receiving an data signal, TEST_EN, e.g. which is a test signal on the different source clock domain SYNCCLK as the target clock signal, FIFOCLK, and provided from the device for aligning the output timing of the signal data, wherein the FF 10 is configured to sample the data signal at a first sampling phase, when the phase relationship indicates that a value of a phase difference between the source clock signal and the target clock signal is in a first predetermined range, e.g. smaller than a predetermined value, in case the phase difference has a potential risk to lead metastability, the phase of sampling the data signal is inverted to move sampling time instances away from clock edges of the source clock signal, to obtain a sampled signal. The information about the phase relationship between the source clock domain SYNCCLK and the target clock domain FIFOCLK is measured by the phase-to-digital converter (PDC) 6.

The signal selector, i.e., multiplexer 12 is coupled to the device 2 for receiving the data signal TEST_EN and coupled to the first FF 10 to receive the sampled signal, wherein the multiplexer 12 is configured to select one of the received signals, e.g. in dependence on the phase relationship, to obtain a selected signal, EN_SYNC. The multiplexer 12 selects one of input signals based on the information about the phase relationship.

The second FF 14 is coupled to the multiplexer 12 for receiving the selected signal EN_SYNC, wherein the second FF14 is configured to sample the data signal TEST_EN at a second sampling phase, when the phase relationship is in a second predetermined range, e.g. which is different from the first predetermined range and typically non-overlapping with the first predetermined range, and which may, for example, indicate that a value of a phase difference between the synchronizing clock signal and the converter clock signal is larger than a predetermined value; in this case, the edge of the sampled signal is synchronized with the converter clock signal, i.e. output timing of the signals are aligned and therefore, it is not necessary to align the rising timing of the clock signal.

Figure 6:
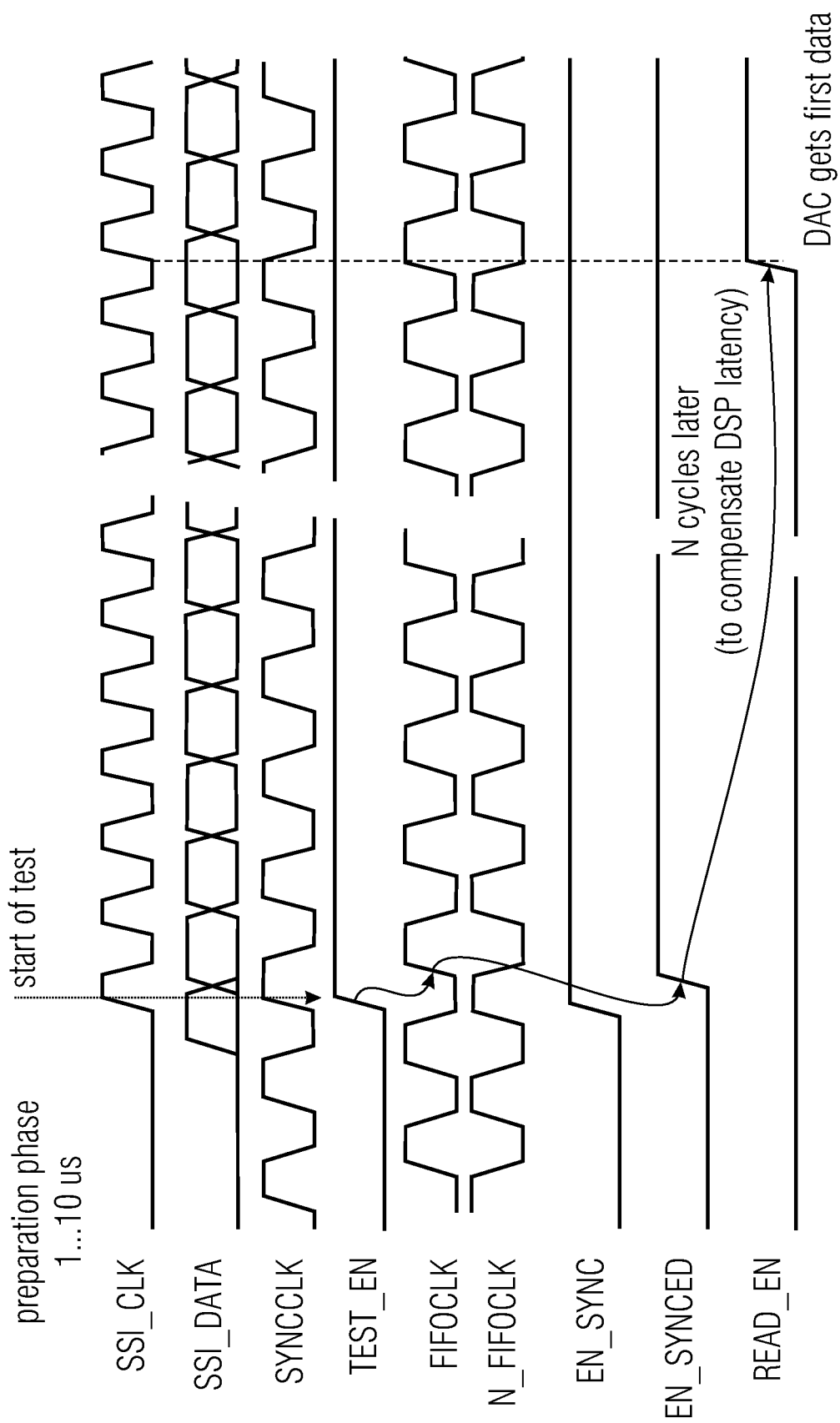
FIG. 6 shows a schematic timing diagram for explaining normal resynchronization process in case no ambiguity is given.

FIG. 6 shows a schematic timing diagram for explaining normal resynchronization process in case no ambiguity is given. As shown in FIG. 6, when the test is started, the source clock signal, SYNCCLK, data signal and TEST_EN are synchronized, and the target clock signal, FIFOCLK, and the synchronized data signal, EN_SYNCED, are synchronized. In this example, the rising edge of the source clock signal and the rising edge of the target clock signal are far away. In this case the multiplexer 12 would be switched to use the TEST_EN directly as source for the selected signal, EN_SYNC, bypassing flip-flop 10.

Since the rising edges of the source clock signal and the target clock signal are far away, there will be no ambiguity in capturing the EN_SYNC signal by flip-flop 14. The digital circuit (converter) 4 is able to receive data signal at a correct timing.

Figure 7:
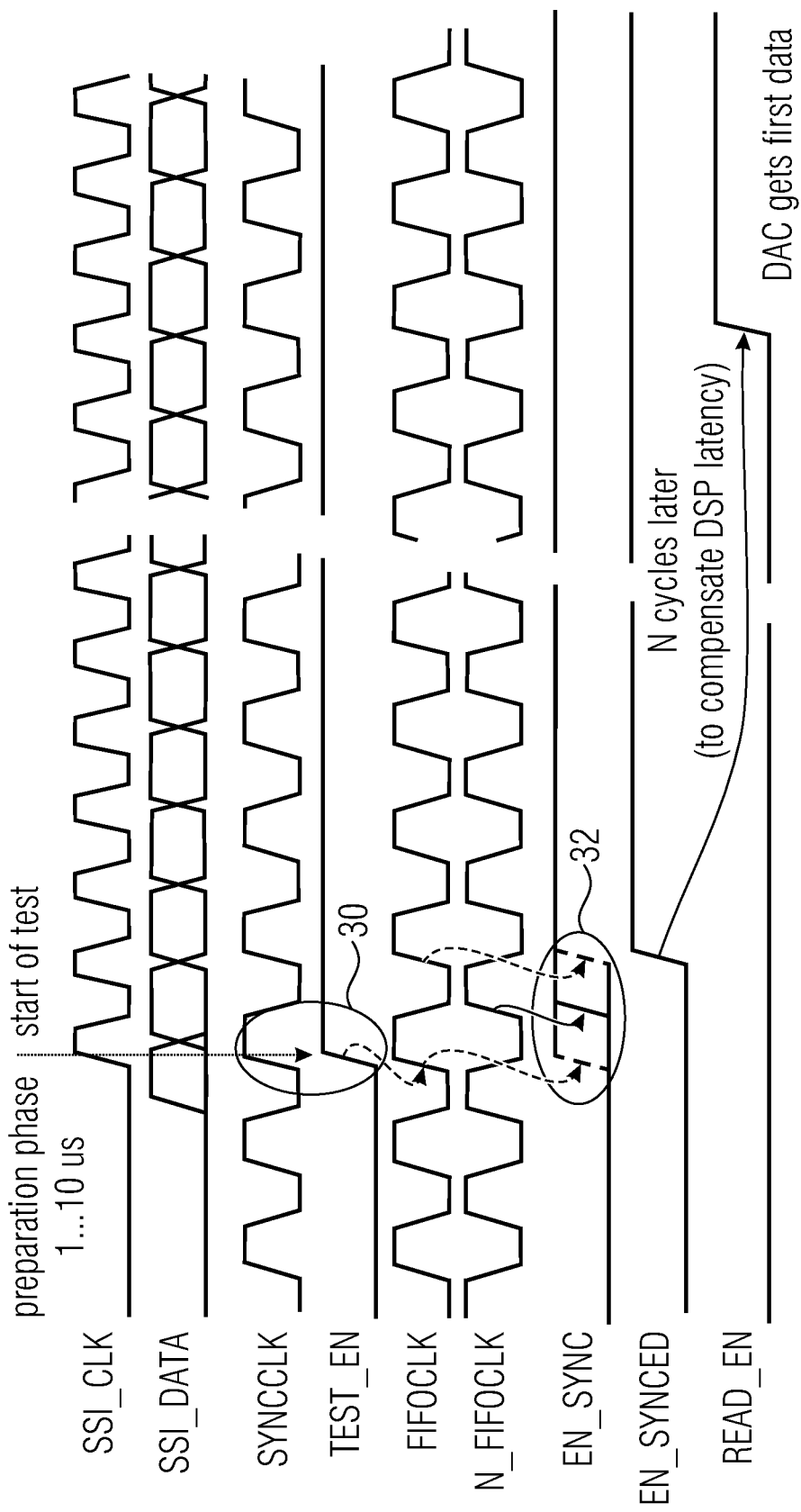
FIG. 7 shows a schematic timing diagram according to the third embodiment of the present invention of the present application.

FIG. 7 shows a schematic timing diagram according to the third embodiment of the present invention. Difference to FIG. 6 is that the clock edges of the source clock signal, SYNCCLK, and the target clock signal, FIFOCLK, are very close to each other. As indicated in FIG. 7, beginning of the waveform is determined by data signal, TEST_EN, and therefore, as indicated by reference number 30, it is possible to match the rising edge of the source clock signal, SYNCCLK, to the rising edge of the data signal, TEST_EN. In this case, the rising edge of the source clock signal and the rising edge of the data signal are very close. In this case capturing the TEST_EN signal with the rising edge of the target clock signal would lead to ambiguity because of the violation of the setup/hold criteria of the capturing flip-flop, it becomes unclear in which clock cycle of the target clock signal the TEST_EN signal is captured. To overcome with this situation the signal TEST_EN is first captured with a flip-flop 10 capturing data on the rising edge of N_FIFOCLK (which is equivalent to capturing on the falling edge of FIFOCLK) resulting in the signal EN_SYNC. Then a second flip-flop 14 captures EN_SYNC on the rising edge of FIFOCLK to generate the signal EN_SYNCED. The synchronized data signal, EN_SYNCED, is always in response to the rising edge of the target clock signal. Ambiguities, i.e. ambiguity on sampling the data signal, TEST_EN, are avoided by switching to a signal that has been captured by the inverted target clock signal N_FIFOCLK. Hence, it is possible to provide the data signal to the digital circuit at a correct timing.

As described above, the beginning of the waveform is determined by the data signal, TEST_EN signal, and therefore, timing requirements at data interface is relatively relaxed.

Figure 14:
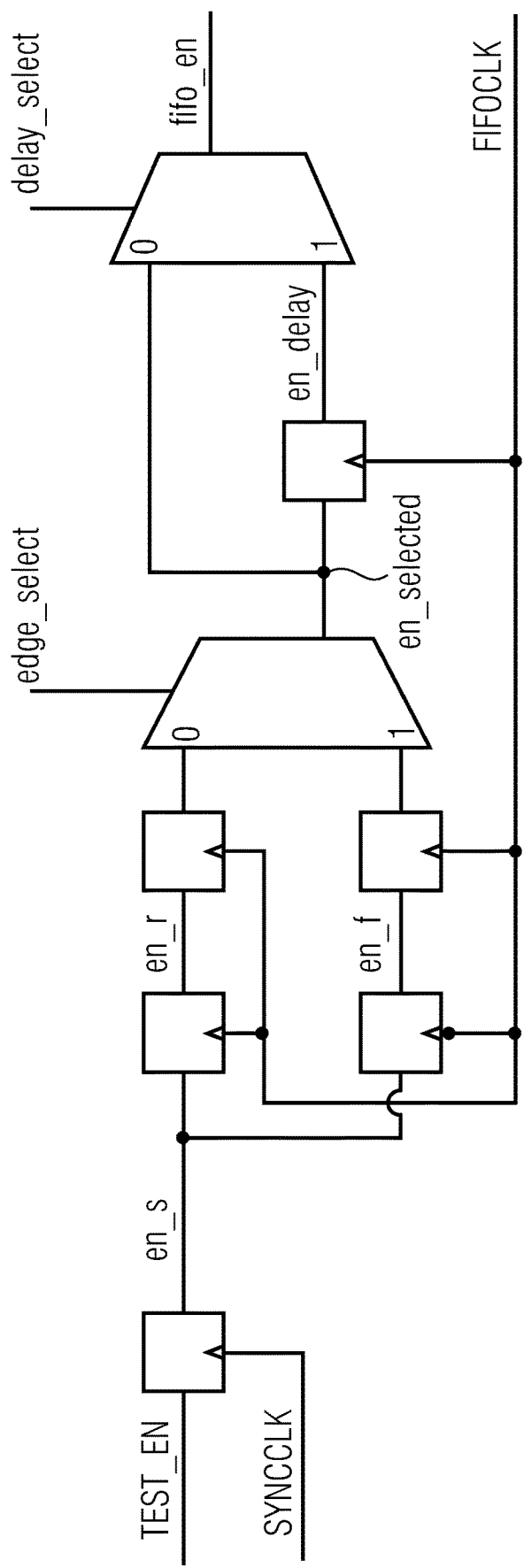
FIG. 14 shows a schematic block diagram of a circuit for transferring data from one clock domain to another clock domain according to a modification embodiment of the present invention of the present application.
Figure 15:
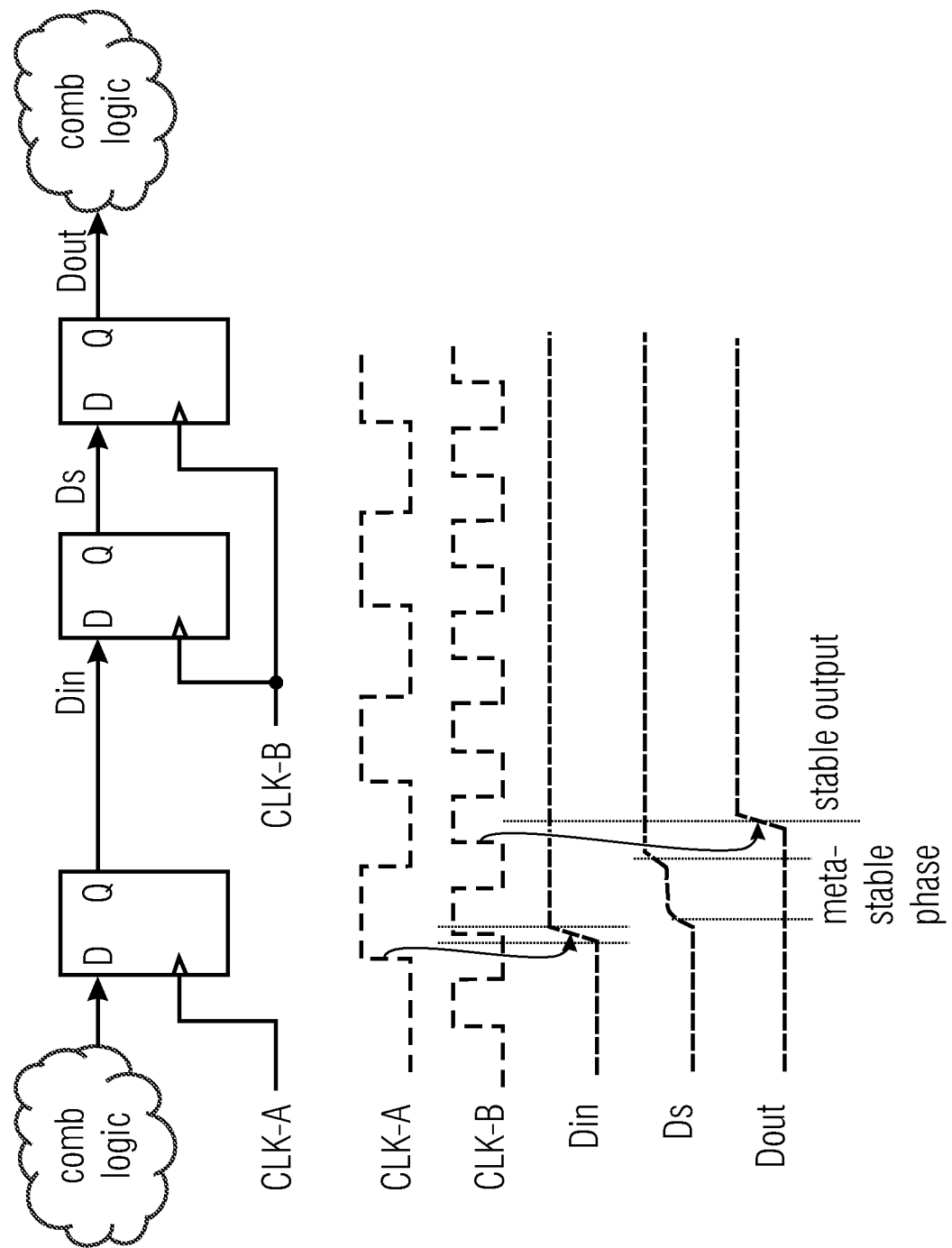
FIG. 15 shows a schematic block diagram and a schematic timing chart according to an example of the prior art.
Figure 16:
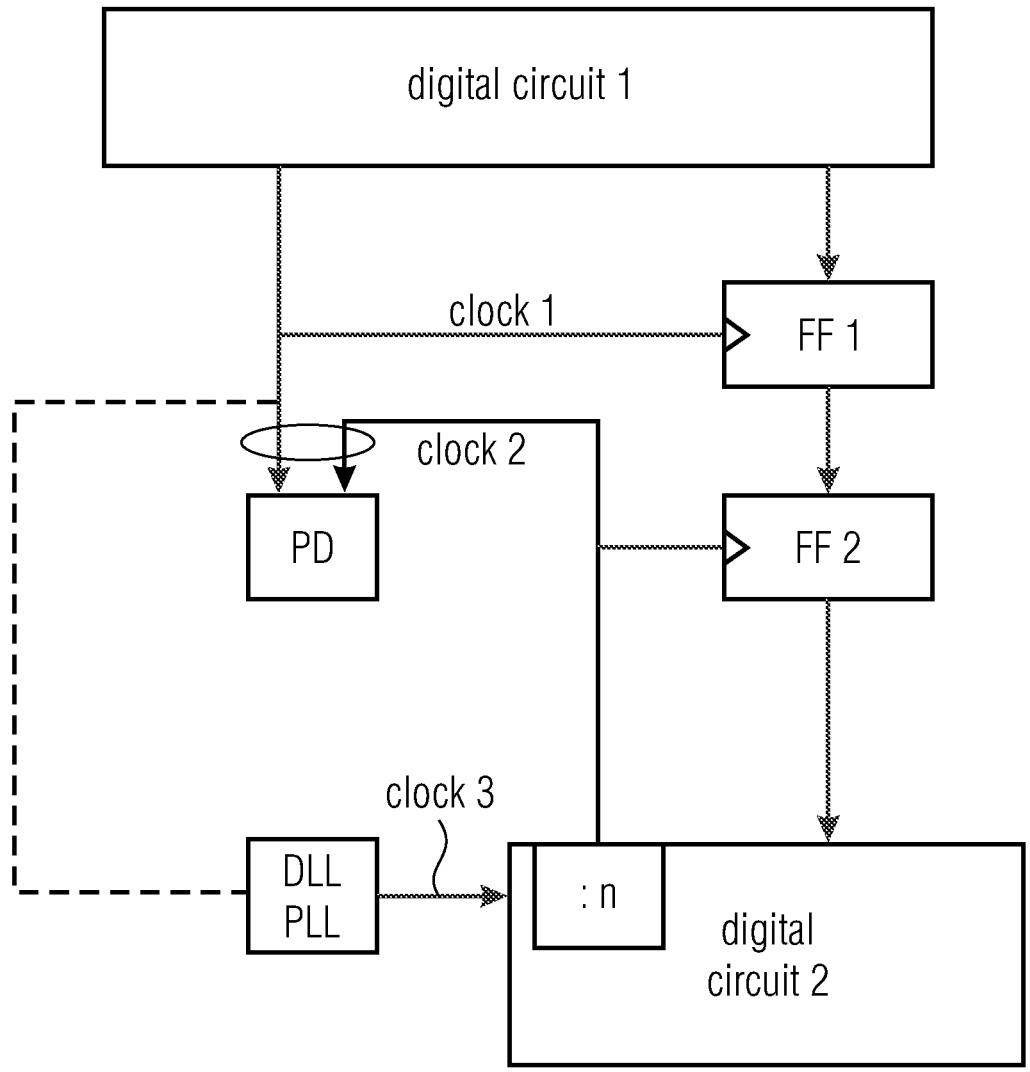
FIG. 16 shows schematic block diagram according to an example of the prior art to avoid ambiguity.
Figure 17:
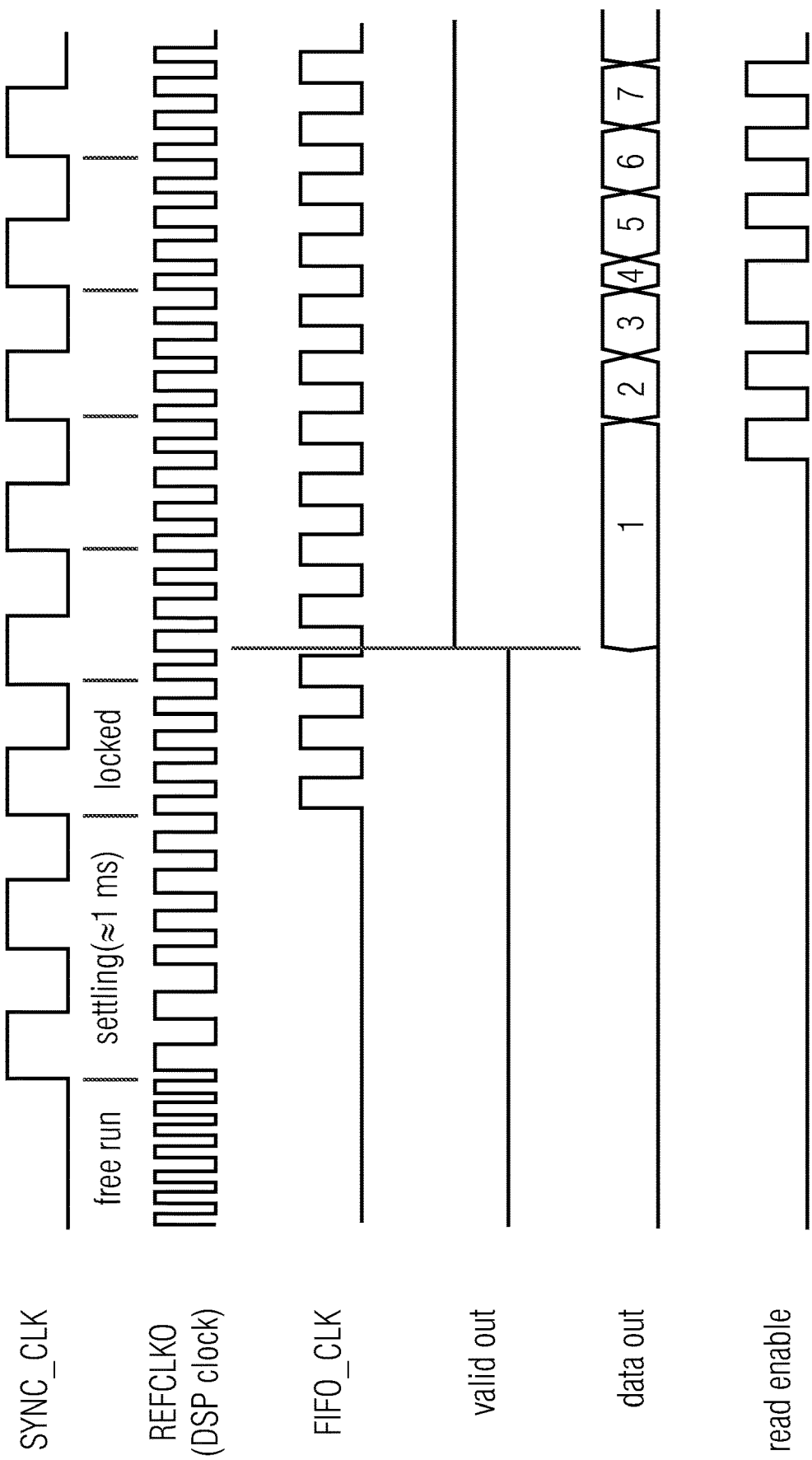
FIG. 17 shows a schematic timing diagram according to a prior art.

FIG. 8 shows a decision diagram of an operation of processing block as it could be implemented in the embodiment of the present application shown in FIG. 14. The block has a function to get measured phase value from PDC, e.g. PDC 6, to decide which operation case is relevant and to apply edge_select and delay_select accordingly.

Figure 9:
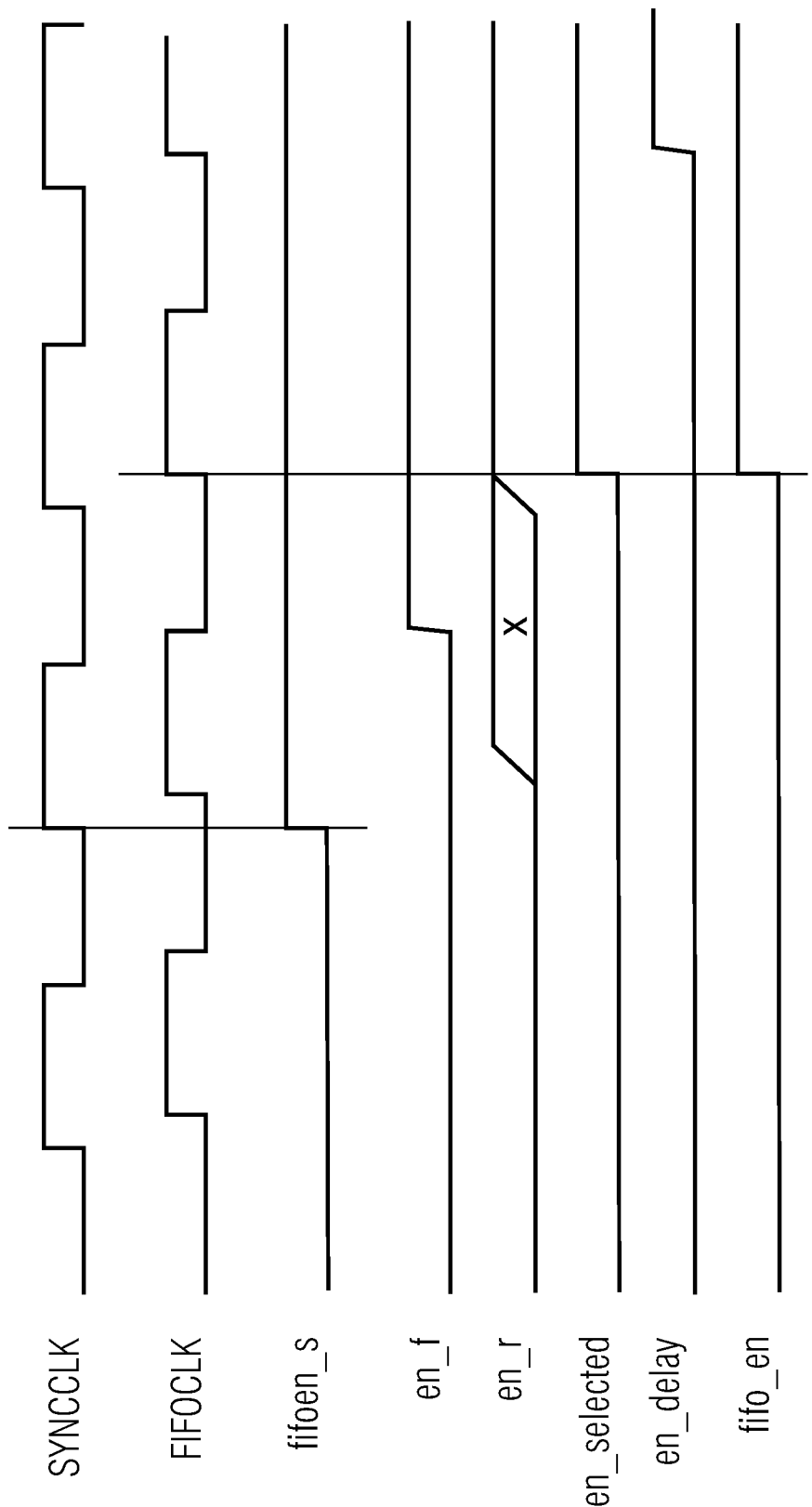
FIG. 9 shows a schematic timing chart of the operation case 1 indicated in the schematic diagram of FIG. 8.

FIG. 9 shows a schematic timing chart of the operation case 1 indicated in the schematic diagram shown in FIG. 14 and the decision diagram of FIG. 8. The operation case 1 indicates a case that a signal en_r shows an ambiguity. In addition, the operation case 1 has following criteria:

$0 \leq phase < 0.25$, edge_select=fall(1), and delay_select=no(0).

Figure 10:
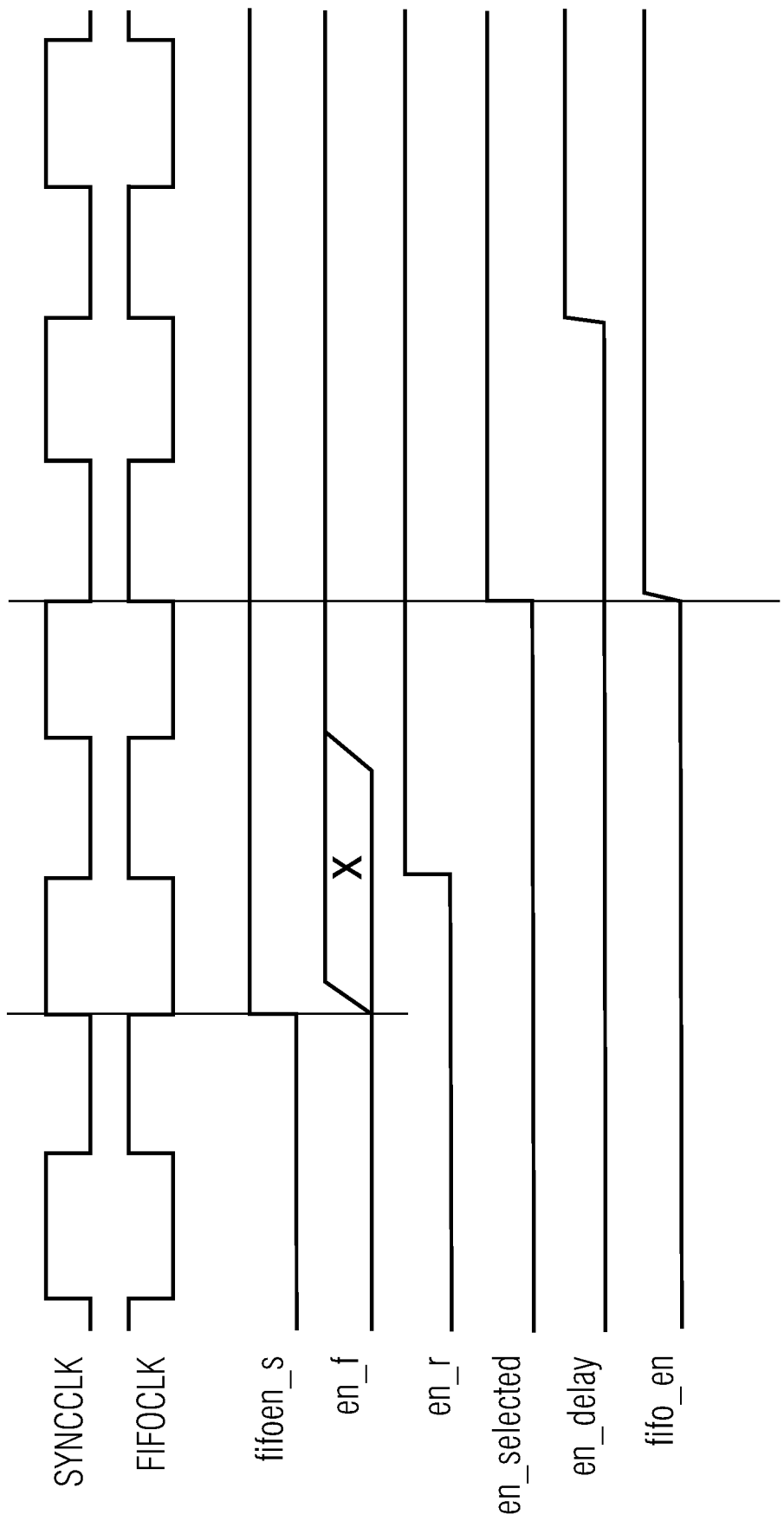
FIG. 10 shows a schematic timing chart of the operation case 2 indicated in the schematic diagram of FIG. 8.

FIG. 10 shows a schematic timing chart of the operation case 2 indicated in the schematic diagram shown in FIG. 14 and the decision diagram of FIG. 8. The operation case 2 indicates a case that a signal en_f shows an ambiguity. In addition, the operation case 2 has following criteria:

$0.25 \leq phase < 0.75$ edge_select=rise(0)

delay_select=no(0)

Figure 11:
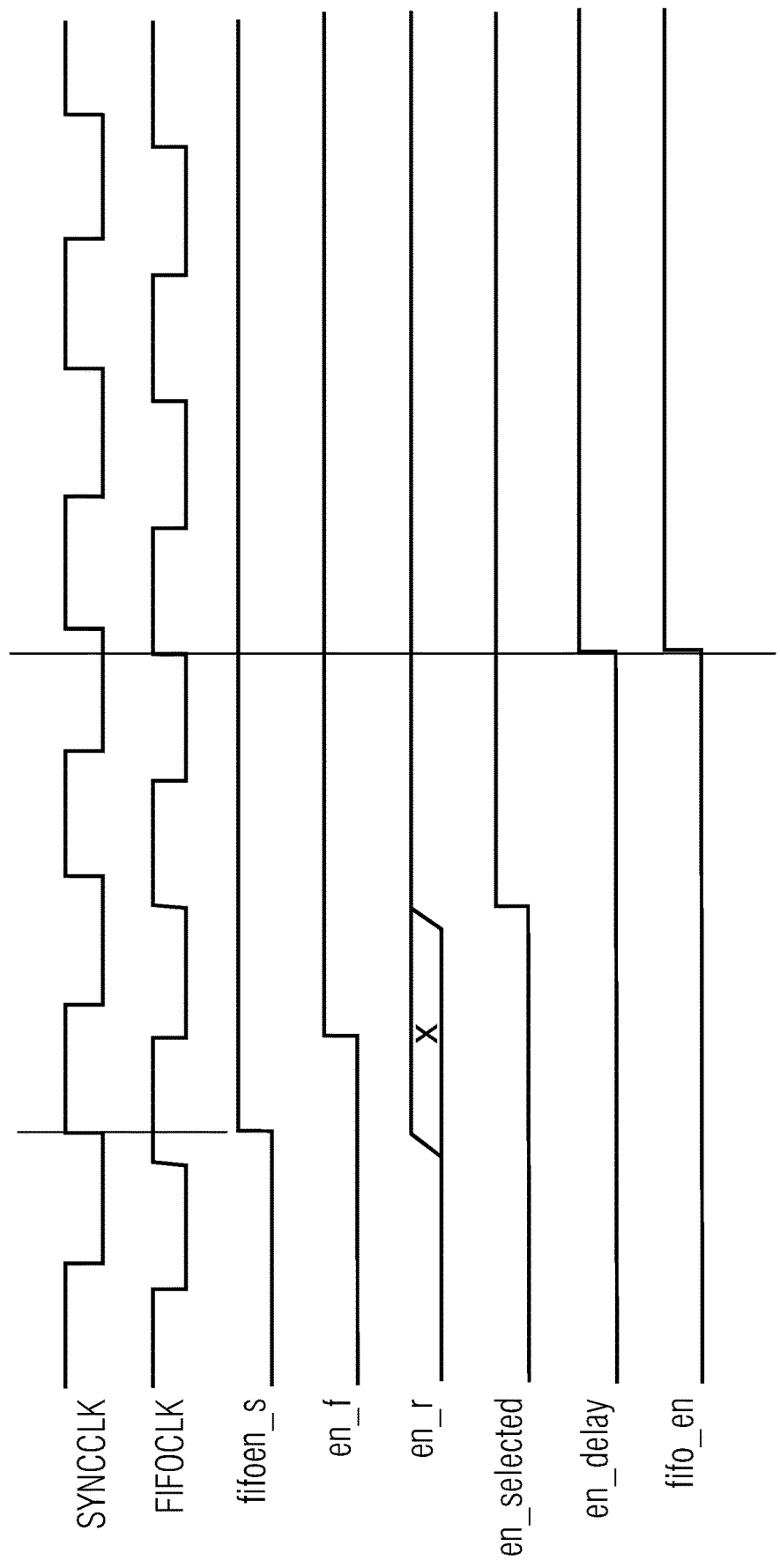
FIG. 11 shows a schematic timing chart of the operation case 3 indicated in the schematic diagram of FIG. 8.

FIG. 11 shows a schematic timing chart of the operation case 3 indicated in the schematic diagram shown in FIG. 14 and the decision diagram of FIG. 8. The operation case 3 indicates a case that a signal en_r shows ambiguity, extra delay is applied. In addition, the operation case 3 has following criteria:

$0.75 \leq phase < 1$ edge_select=fall(1)

delay_select=yes(1)

Figure 12:
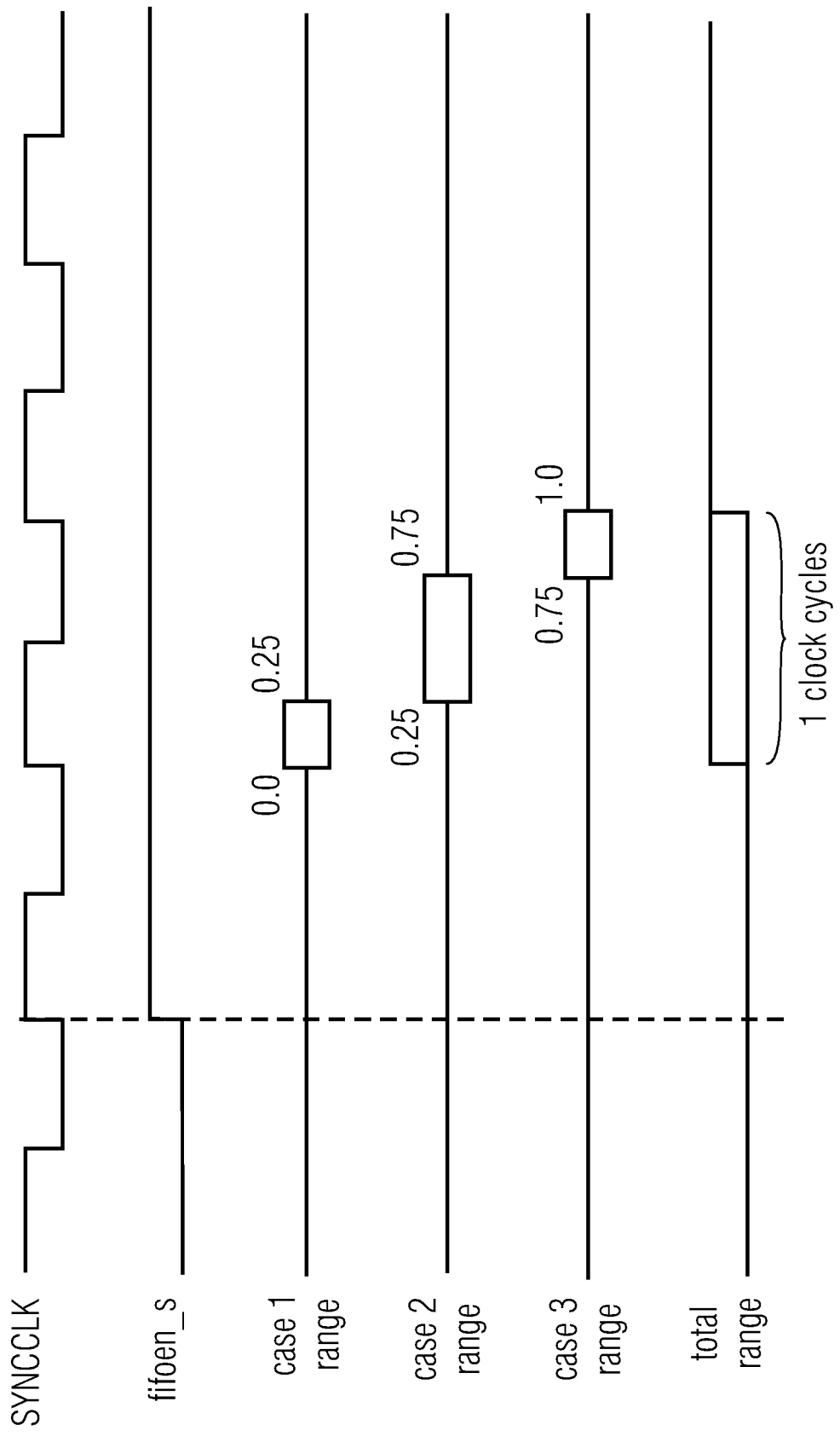
FIG. 12 shows a schematic illustration indicating operation ranges of all three cases indicated in the schematic diagram of FIG. 8.

FIG. 12 shows a schematic illustration indicating operation ranges of all three cases indicated in the schematic diagram shown in FIG. 14 and the decision diagram of FIG. 8. As indicated in FIG. 12, raising edge of synchronized signal fifo_en will occur one and two click cycles after rising edge of the source signal fifoen_s. Therefore, the ambiguity of respective cases 1 to 3 is effectively avoided.

Figure 13:
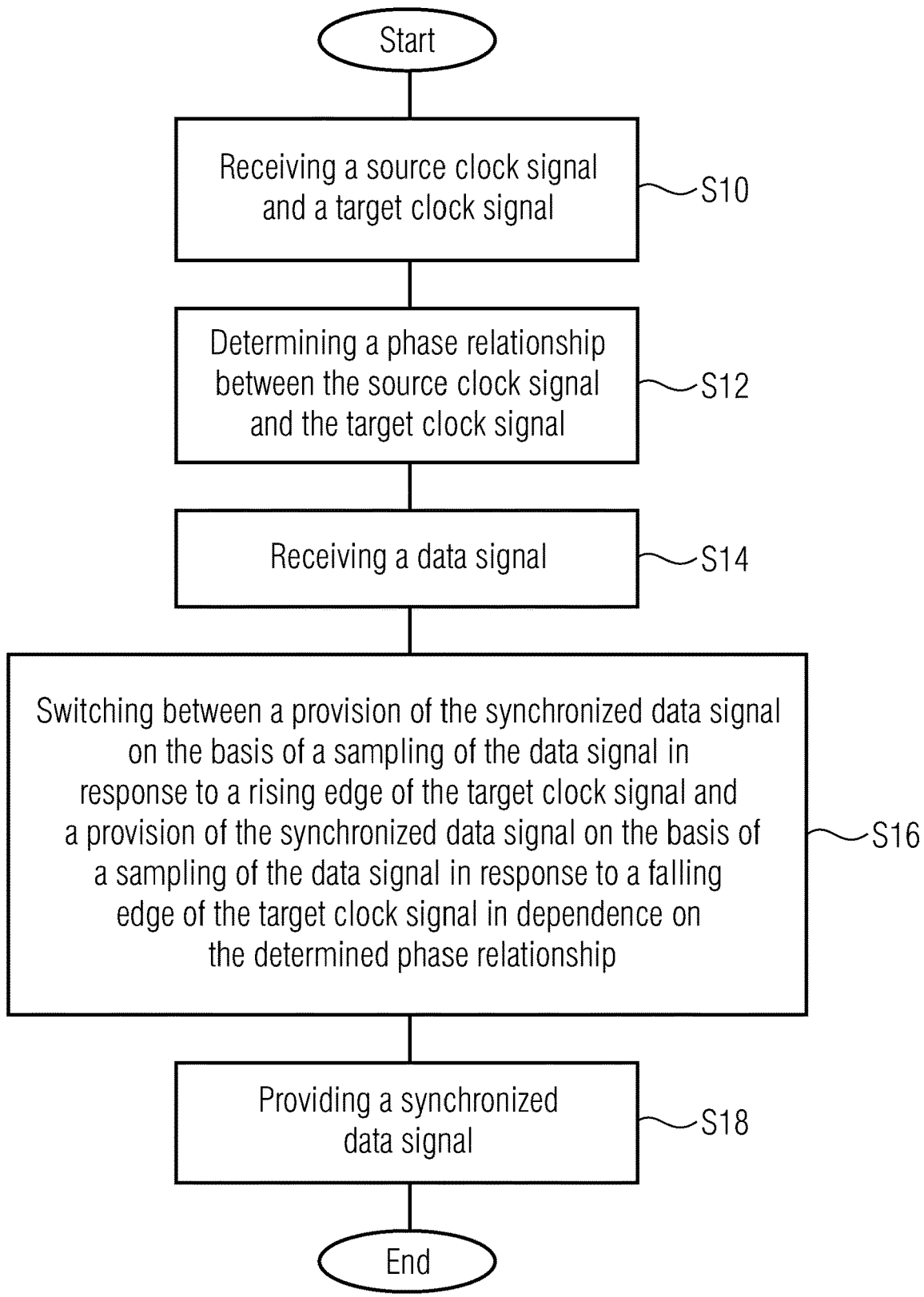
FIG. 13 shows a flowchart indicating steps of a method for transferring data from one clock domain to another clock domain according to a fourth embodiment of the present invention concept of the present application.

FIG. 13 shows a flowchart indicating steps of a method for transferring a data from one clock domain to another clock domain according to a fourth embodiment of the present invention.

At first, receiving a source clock signal and a target clock signal used by a digital circuit (Step 10). That is, a phase comparator, i.e. the PDC 6 as shown in FIG. 1, for instance, receives the source clock signal and the target clock signal from the digital circuit, i.e. the digital circuit 4 in FIG. 1 or FIG. 2, for instance. The synchronizing clock may be provided from a processor, a memory or a loop-back interface.

Next, determining a phase relationship between the source clock signal and the target clock signal (S12) and receiving a data signal from the device (S14). That is, at the data signal synchronization circuit, e.g. the data signal synchronization circuit 8 in FIG. 1 or FIG. 2, receives the data signal transitions of which are in synchronism with the source clock signal.

Then, switching between a provision of the synchronized data signal, e.g. EN_SYNCED on the basis of a sampling of the data signal, e.g. TEST_EN in response to a rising edge of the target clock signal, e.g. FIFOCLK and a provision of the synchronized data signal, EN_SYNCED, on the basis of a sampling of the data signal, TEST_EN, in response to a falling edge of the target clock signal, FIFOCLK, in dependence on the determine phase relationship between the source clock signal and the target clock signal (S16). That is, the data signal synchronization circuit selects the sampled type, e.g. sampled at raising edges or at falling edges as shown in FIG. 7. A frequency relationship between the source clock signal and the target clock signal is locked at the predetermined value. Then, a synchronized data signal on the basis thereof, e.g. the synchronization data signal having a selected provision, e.g. EN_SYNCED is provided to the digital circuit 4 via the FIFO 16 (S18).

According to a fourth aspect of the present application, computer program is provided, wherein the computer program is configured to implement the above described method, when being executed on a computer or micro controller, so that the above described method is implemented by the computer program.

FIG. 14 shows the schematic of a modification example of the disclosed embodiment. As mentioned above, the embodiments of the present application solve the ambiguity problem by using the PDC to measure the phase difference between the both clock domains and then use a special receiving circuit that is capable to capture the TEST_EN signal either on the rising or falling edge of the receiving clock. A control logic decides which edge is suitable. This avoids the ambiguity of two clock cycle for the test start because it is possible to determine exactly which clock cycle is capturing the signal as shown in FIG. 14.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, one or more of the most important method steps may be executed by such an apparatus.

The inventive data stream can be stored on a digital storage medium or can be transmitted on a transmission medium such as a wireless transmission medium or a wired transmission medium such as the Internet.

Depending on certain implementation requirements, embodiments of the application can be implemented in hardware or in software. The implementation can be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present application can be implemented as a computer program product with a program code, the program code being operative for performing one of the methods when the computer program product runs on a computer. The program code may, for example, be stored on a machine readable carrier.

Other embodiments comprise a computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may, for example, be configured to be transferred via a data communication connection, for example via the internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The apparatus described herein may be implemented using a hardware apparatus, or using a computer, or using a combination of a hardware apparatus and a computer.

The apparatus described herein, or any components of the apparatus described herein, may be implemented at least partially in hardware and/or in software.

The above described embodiments are merely illustrative for the principles of the present invention. It is understood that modifications and variations of the arrangements and the details description herein will be apparent to others skilled in the art. It is the intent, therefore, to be limited only by the scope of the impending patent claims and not by the specific details presented by way of description and explanation of the embodiments herein.

The invention claimed is:

1. A circuit for transferring a data from a first clock domain to a second clock domain, the circuit comprising:
a data synchronization circuit for generating a synchronized data signal;
a digital circuit associated with the second clock domain and coupled to the data synchronization circuit to receive the synchronized data signal, and wherein the digital circuit is configured to receive the synchronized data signal and to sample the synchronized data signal;
a phase comparator coupled to the digital circuit, wherein the phase comparator is configured to determine a phase relationship between a source clock signal of the first clock domain and a target clock signal; and
wherein the data signal synchronization circuit is coupled to the phase comparator and the digital circuit, wherein the data synchronization circuit is configured to receive a data signal synchronized to the source clock signal, and to provide the synchronized data signal to the digital circuit synchronized to the target clock signal, and
further the data signal synchronization circuit is configured to alternate operation between providing the synchronized data signal by sampling the data signal in response to a rising edge of the target clock signal and providing of the synchronized data signal by sampling the data signal in response to a falling edge of the target clock signal based on the phase relationship between the source clock signal and the target clock signal, and wherein the source clock signal and the target clock signal have a predetermined frequency relationship.

2. The circuit according to claim 1, wherein the data synchronization circuit is configured to select, based on information about the phase relationship between the source clock signal and the target clock signal, between:
a first mode, wherein the data signal that is in temporal synchronism with the source clock signal is sampled at edges of a first edge type of the target clock signal to obtain an intermediate signal, and wherein the intermediate signal is sampled at edges of a second edge type of the target clock signal to obtain the synchronized data signal which is in temporal synchronism with the target clock signal, and
a second mode, wherein the data signal, that is in temporal synchronism with the source clock signal is sampled at edges of the second edge type of the target clock signal to obtain the synchronized data signal which is in temporal synchronism with the target clock signal.

3. The circuit according to claim 1, wherein the data synchronization circuit comprises:
a first flip-flop circuit configured to receive the data signal from the first clock domain, wherein the first flip-flop circuit is configured to sample the data signal at a first sampling phase to obtain a sampled signal;
a signal selector configured to receive the data signal from the first clock domain, wherein the signal selector is coupled to the first flip-flop circuit to receive the sampled signal, and wherein the signal selector is configured to select one of the received data or sampled signals to obtain a selected signal; and
a second flip-flop circuit coupled to the signal selector to receive the selected signal, and wherein the second flip-flop circuit is configured to sample the selected signal at a second sampling phase.

4. The circuit according to claim 3, wherein the data synchronization circuit further comprises:
a first-in-first-out circuit coupled to a data source to receive the data signal and coupled to the second flip-flop circuit to receive an output signal or a delayed version of the output signal of the second flip-flop circuit, wherein the first-in-first-out circuit provides data to the digital circuit in response to the output signal or the delayed version of the output signal of the second flip-flop circuit.

5. The circuit according to claim 4, wherein the first-in-first-out circuit is coupled to an output of the second flip-flop circuit via a delay circuit which delays the output signal of the second flip-flop circuit.

6. The circuit according to claim 3, wherein the signal selector comprises a multiplexer, and wherein the multiplexer selects one of the received data signal or the sampled signal based on the phase relationship.

7. The circuit according to claim 1,
wherein the source clock signal is generated using a device under test, and
wherein the digital circuit is a converter configured to convert data between analog and digital to generate an analog or digital signal, and
wherein the data signal is an enable signal operable to trigger a conversion between the analog and digital signals.

8. The circuit according to claim 7, wherein the digital circuit comprises a digital-to-analog converter.

9. The circuit according to claim 7, wherein the digital circuit comprises an analog-to-digital converter.

10. The circuit according to claim 1, wherein the phase comparator comprises a phase-to-digital converter, wherein the phase-to-digital converter is configured to measure a phase difference between the source clock signal and the target clock signal for determining the phase relationship.

11. The circuit according to claim 1 further comprising an oscillator, wherein an output signal of the oscillator is used as or to derive the target clock signal.

12. The circuit according to claim 1, wherein the source clock signal and the target clock signal are derived from a common reference signal, wherein the source clock signal and the target clock signal are in a predetermined frequency relationship, and wherein further there is no phase lock between a phase of the source clock signal and a phase of the target clock signal.

13. A test apparatus for testing a device under test, the test apparatus comprising:
a data synchronization circuit;
a digital circuit coupled to the data synchronization circuit, wherein the data synchronization circuit is configured to generate a synchronized data signal synchronized to a source clock signal of a first clock domain, and wherein the digital circuit is configured to receive and sample the synchronized data signal synchronized to a target clock signal in a second clock domain;
a phase comparator coupled to the digital circuit, wherein the phase comparator is configured to determine a phase relationship between the source clock signal and the target clock signal; and
wherein the data synchronization circuit is coupled to the phase comparator and the digital circuit, wherein the data synchronization circuit is configured to receive a data signal synchronized to the source clock signal associated with the first clock domain, and to provide the synchronized data signal to the digital circuit synchronized to the target clock signal associated with the second clock domain, and wherein the data synchronization circuit is configured to alternate operation between providing the synchronized data signal by sampling the data signal in response to a rising edge of the target clock signal or providing the synchronized data signal by sampling the data signal in response to a falling edge of the target clock signal depending on the phase relationship between the source clock signal and the target clock signal, and wherein further the source clock signal and the target clock signal have a predetermined frequency relationship.

14. The test apparatus according to claim 13, wherein a test flow synchronized with the source clock signal is performed using the digital circuit, the phase comparator and the data synchronization circuit.

15. The test apparatus according to claim 14, wherein the source clock signal is generated by the device under test.

16. A method for transferring a data from one clock domain to another, the method comprising:
receiving a source clock signal and a target clock signal;
determining a phase relationship between the source clock signal and the target clock signal;
receiving a data signal, and providing a synchronized data signal on a basis thereof; and
wherein the providing the synchronized data signal comprises switching between providing the synchronized data signal on the basis of a sampling of the data signal in response to a rising edge of the target clock signal and providing the synchronized data signal on the basis of a sampling of the data signal in response to a falling edge of the target clock signal and wherein the switching is based on the phase relationship between the source clock signal and the target clock signal; and wherein further the source clock signal and the target clock signal are locked at a predetermined frequency relationship.

17. The method of claim 16, further comprising:
alternating between, based on the phase relationship between the source clock signal and the target clock signal: (a) a first mode wherein the data signal is sampled at edges of a first edge type of the target clock signal to obtain an intermediate signal, and in which the intermediate signal is sampled at edges of a second edge type of the target clock signal to obtain the synchronized data signal, and (b) a second mode, wherein the data is sampled at edges of the second edge type of the target clock signal to obtain the synchronized data signal which is in temporal synchronism with the target clock signal.

18. The method of claim 17, wherein the target clock signal is derived from an output signal of an oscillator.

19. The method of claim 17, wherein the determining the phase relationship comprises measuring a phase difference between the source clock signal and the target clock signal.

20. The method of claim 17, wherein the source clock signal and the target clock signal are derived from a common reference signal, wherein frequencies of the source clock signal and of the target clock signal are in the predetermined frequency relationship, and wherein there is no phase lock between phases of the source clock signal and the target clock signal.

* * * * *